United States Patent
Linkov et al.

(10) Patent No.: US 11,107,945 B2
(45) Date of Patent: Aug. 31, 2021

(54) COMPONENT WITH END-SIDE MOUNTED LIGHT EMITTING SEMICONDUCTOR CHIP

(71) Applicant: OSRAM Opto Semiconductors GmbH, Regensburg (DE)

(72) Inventors: Alexander Linkov, Regensburg (DE); Frank Singer, Regenstauf (DE); Matthias Bruckschloegl, Regensburg (DE); Siegfried Herrmann, Neukirchen (DE); Jürgen Moosburger, Lappersdorf (DE); Thomas Schwarz, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 61 days.

(21) Appl. No.: 15/820,930

(22) Filed: Nov. 22, 2017

(65) Prior Publication Data
US 2018/0175237 A1    Jun. 21, 2018

(30) Foreign Application Priority Data
Nov. 25, 2016    (DE) ..................... 10 2016 122 810.9

(51) Int. Cl.
*H01L 33/00*    (2010.01)
*H01L 25/075*    (2006.01)
(Continued)

(52) U.S. Cl.
CPC ........ *H01L 33/0008* (2013.01); *H01L 25/075* (2013.01); *H01L 33/38* (2013.01);
(Continued)

(58) Field of Classification Search
CPC ... H01L 33/0008; H01L 33/486; H01L 33/38; H01L 25/075
See application file for complete search history.

(56) References Cited

U.S. PATENT DOCUMENTS

| 4,136,351 | A | 1/1979 | Sugawara et al. |
| 5,265,792 | A | 11/1993 | Harrah et al. |
| (Continued) | | | |

FOREIGN PATENT DOCUMENTS

| DE | 27 21 250 | 11/1977 |
| DE | 195 44 980 | 6/1996 |
| (Continued) | | |

*Primary Examiner* — Matthew E. Gordon
(74) *Attorney, Agent, or Firm* — DLA Piper LLP (US)

(57) ABSTRACT

A component includes a light emitting semiconductor chip, wherein the semiconductor chip includes a layer arrangement including a plurality of layers, the p-conducting layer and the n-conducting layer adjoin one another in an active zone, a first electrical contact is configured on the p-conducting side of the layer arrangement at a first side of the semiconductor chip, a second electrical contact is configured on the n-conducting side of the layer arrangement at a second side of the semiconductor chip, the second side being situated opposite the first side of the semiconductor chip, the first side of the semiconductor chip transitions into the second side via an end side, the semiconductor chip is secured by the end side on a substrate, the substrate includes a first and second further electrical contact, and the further electrical contacts electrically conductively connect to the electrical contacts of the semiconductor chip.

19 Claims, 7 Drawing Sheets

(51) Int. Cl.
  *H01L 33/48* (2010.01)
  *H01L 33/38* (2010.01)
  *H01L 33/62* (2010.01)
(52) U.S. Cl.
  CPC ............ *H01L 33/486* (2013.01); *H01L 33/62* (2013.01); *H01L 2933/005* (2013.01)

(56) References Cited

U.S. PATENT DOCUMENTS

| | | | |
|---|---|---|---|
| 5,814,837 | A | 9/1998 | Okazaki |
| 6,018,167 | A | 1/2000 | Oota |
| 2002/0123164 | A1* | 9/2002 | Slater, Jr. ............... H01L 33/405 438/39 |
| 2003/0189829 | A1* | 10/2003 | Shimizu ................... F21L 4/00 362/240 |
| 2004/0140551 | A1* | 7/2004 | Usui ................... H05K 3/4682 257/700 |
| 2007/0267650 | A1* | 11/2007 | Hsieh ...................... H01L 33/38 257/99 |
| 2008/0073659 | A1* | 3/2008 | Tamura ................... H01L 33/42 257/97 |
| 2008/0101062 | A1* | 5/2008 | Feng ..................... H01L 33/486 362/231 |
| 2012/0153337 | A1 | 6/2012 | Kong |
| 2015/0349225 | A1* | 12/2015 | Oh ......................... H01L 33/38 257/99 |
| 2016/0300988 | A1* | 10/2016 | Oh ......................... H01L 33/60 |

FOREIGN PATENT DOCUMENTS

| | | |
|---|---|---|
| DE | 197 57 850 | 7/1998 |
| DE | 693 29 522 T2 | 5/2001 |
| WO | 2017/178424 | 10/2017 |

\* cited by examiner

COMPONENT WITH END-SIDE MOUNTED LIGHT EMITTING SEMICONDUCTOR CHIP

TECHNICAL FIELD

This disclosure relates to a component comprising a light emitting semiconductor chip, a method of producing the component and an apparatus for producing the component.

BACKGROUND

It is known for light emitting semiconductor chips to be configured in a plate-shaped fashion with a large-area top side and underside and with narrow side faces to be mounted by the large-area top side or underside on a substrate.

There is nonetheless a need for a component comprising an improved light emission, an improved method of producing the component and an improved apparatus for producing the component.

SUMMARY

We provide a component including a light emitting semiconductor chip, wherein the semiconductor chip includes a layer arrangement including a plurality of layers including at least one p-conducting layer and one n-conducting layer, the p-conducting layer and the n-conducting layer adjoin one another in an active zone, a first electrical contact is configured on the p-conducting side of the layer arrangement at a first side of the semiconductor chip, a second electrical contact is configured on the n-conducting side of the layer arrangement at a second side of the semiconductor chip, the second side being situated opposite the first side of the semiconductor chip, the first side of the semiconductor chip transitions into the second side via an end side, the semiconductor chip is secured by the end side on a substrate, the substrate includes a first and second further electrical contact, and the further electrical contacts electrically conductively connect to the electrical contacts of the semiconductor chip.

We also provide a method of producing the component including a light emitting semiconductor chip, wherein the semiconductor chip includes a layer arrangement including a plurality of layers including at least one p-conducting layer and one n-conducting layer, the p-conducting layer and the n-conducting layer adjoin one another in an active zone, a first electrical contact is configured on the p-conducting side of the layer arrangement at a first side of the semiconductor chip, a second electrical contact is configured on the n-conducting side of the layer arrangement at a second side of the semiconductor chip, the second side being situated opposite the first side of the semiconductor chip, the first side of the semiconductor chip transitions into the second side via an end side, the semiconductor chip is secured by the end side on a substrate, the substrate includes a first and second further electrical contact, and the further electrical contacts electrically conductively connect to the electrical contacts of the semiconductor chip, wherein a light emitting semiconductor chip is provided, the semiconductor chip includes a layer arrangement including a plurality of layers including at least one p-conducting layer and one n-conducting layer, the p-conducting layer and the n-conducting layer adjoin one another in an active zone, a first electrical contact is configured on the p-conducting side of the layer arrangement at a first side of the semiconductor chip, a second electrical contact is arranged on the n-conducting side of the layer arrangement at a second side of the semiconductor chip, the second side being situated opposite the first side of the semiconductor chip, the first side transitions into the second side via an end side, the semiconductor chip is secured by the end side on a substrate, the substrate includes further electrical contacts, and the further electrical contacts electrically conductively connect to the electrical contacts of the semiconductor chip.

We further provide an apparatus for producing the component including a light emitting semiconductor chip, wherein the semiconductor chip includes a layer arrangement including a plurality of layers including at least one p-conducting layer and one n-conducting layer, the p-conducting layer and the n-conducting layer adjoin one another in an active zone, a first electrical contact is configured on the p-conducting side of the layer arrangement at a first side of the semiconductor chip, a second electrical contact is configured on the n-conducting side of the layer arrangement at a second side of the semiconductor chip, the second side being situated opposite the first side of the semiconductor chip, the first side of the semiconductor chip transitions into the second side via an end side, the semiconductor chip is secured by the end side on a substrate, the substrate includes a first and second further electrical contact, and the further electrical contacts electrically conductively connect to the electrical contacts of the semiconductor chip, wherein a film is provided to receive the semiconductor chips by an underside on a top side of a film, a track is provided for the film to move the film on the track, the track transitions from a planar section into a curved section in the direction of movement of the film, a shearing element is provided in the curved section, the curved section of the track is configured such that the film is released from the underside of the semiconductor chip at a side of the semiconductor chip that is on the end side in the direction of movement of the track, and a release region arises, the shearing element comprises a shearing edge, the shearing edge engages into the release region between the semiconductor chip and the film, the shearing element is configured such that upon a further movement of the film the semiconductor chip slides by the underside along a top side of the shearing element and is moved with the end side on to a top side of a further carrier, and the end side is secured at the top side of the further carrier.

Figure 1:
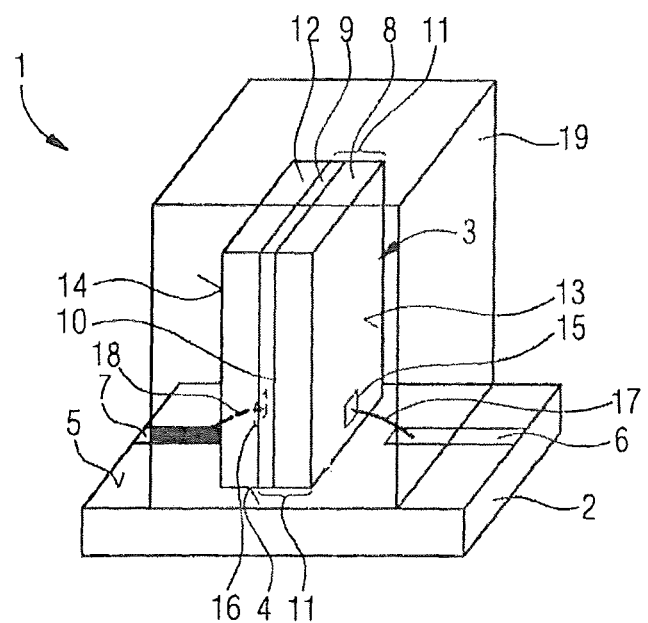
FIG. 1 shows a schematic illustration of a component comprising a semiconductor chip and a substrate.

LIST OF REFERENCE SIGNS 1 component
2 substrate
3 semiconductor chip
4 end side
5 top side of substrate
6 first further contact
7 second further contact
8 p-conducting layer
9 n-conducting layer
10 active zone
11 layer arrangement
12 carrier substrate
13 top side
14 underside
15 first contact
16 second contact
17 first line
18 second line
19 encapsulation
20 first contact track
21 second contact track
22 first leadframe section
23 second leadframe section
24 carrier material
25 first contact element
26 second contact element
27 underside of substrate
28 multilayered carrier
29 upper layer
30 lower layer
31 contact layer
32 connection material
33 first pin
34 second pin
35 second plated-through hole
36 first plated-through hole
37 first section
38 second section
39 thermal plated-through hole
40 first conductor track
41 second conductor track
42 insulation layer
43 first contact pad
44 second contact pad
45 solder material
46 second solder material
47 adhesive layer
48 film
49 roller
50 planar section
51 curved section
53 release region
54 shearing element
55 shearing edge
56 top side of shearing element
57 further carrier
58 first bump
59 second bump

DETAILED DESCRIPTION

One advantage of our component is that an improved light emission is achieved on account of the end-side mounting of the light emitting semiconductor chip on the substrate. Moreover, less area is required as a result of the end-side mounting of the semiconductor chip on the substrate. Furthermore, a simple electrical contacting of the electrical contacts of the semiconductor chip with the further electrical contacts of the substrate may be carried out since the electrical contacts of the semiconductor chip are configured on opposite sides of the semiconductor chip. The risk of an electrical short circuit upon the electrical connection of the electrical contacts of the semiconductor chip to the electrical contacts of the substrate is reduced as a result. Moreover, more space is available for the electrical connection between the electrical contacts of the semiconductor chip and the further electrical contacts of the substrate.

The semiconductor chip is configured as a volume emitting vertical chip, wherein the layer arrangement of the semiconductor layers comprises at least one p-conducting layer and at least one n-conducting layer. The p-conducting layer and the n-conducting layer adjoin one another in an active zone. The active zone is configured to generate electromagnetic radiation when the component is energized.

For the power supply, the semiconductor chip comprises a first electrical contact at a first side. Moreover, for the power supply, the semiconductor chip comprises a second electrical contact at a second side of the semiconductor chip. The first contact connects, for example, to the p-conducting side of the semiconductor chip. The second contact is arranged on the n-conducting side of the layer arrangement and connects to the n-conducting layer of the layer arrangement. The semiconductor chip comprises a plate shape, for example. The semiconductor chip comprises a top side and an opposite underside and laterally arranged side faces. One of the side faces forms the end side by which the semiconductor chip is secured on a top side of the substrate.

In one example, a simple and fast electrical contacting between the electrical contacts of the semiconductor chip and the further electrical contacts of the substrate is achieved by the use of electrically conductive contact elements to connect the electrical contacts of the semiconductor chip to the further electrical contacts of the substrate.

The contact elements may be configured, for example, in the form of contact balls. On account of the geometry, contact balls are suitable for a reliable contacting of electrical contacts that are at a distance from one another. The contact elements may produce an electrical contact with the electrical contacts via a joining connection or via a fusible connection.

The further contacts of the substrate may comprise pins or are formed from pins. The pins may be arranged at a predefined distance on a top side of the substrate, wherein the semiconductor chip is arranged with the end side between the pins on the substrate. The electrical contact between the contacts of the semiconductor chip and the pins may be effected either directly or via further electrical material or electrical lines. By way of example, the pins may electrically conductively connect to the electrical contacts of the semiconductor chip via contact elements, for example, in the form of contact balls.

The pins may be produced on the substrate with the aid of an electrodeposition method. However, other methods of producing and/or mounting pins made from an electrically conductive material may also be used.

The further electrical contacts of the substrate may comprise electrically conductive plated-through holes. The plated-through holes are led from the top side to the underside of the substrate. In this way, electrical terminals of the component may be led on to the underside of the substrate using simple means. By way of example, the further electrical contacts may comprise the pins on the top side and plated-through holes that are led from the top side to the underside.

The further electrical contacts may comprise conductor tracks. The conductor tracks may be configured, for example, as printed conductor tracks. The conductor tracks enable a simple and reliable electrical contacting of the electrical contacts of the semiconductor chip.

The semiconductor chip may comprise on the end side an insulation layer at least in the region of the layer arrangement, wherein the first contact connects to a first contact pad, wherein the first contact pad is led on to the insulation layer. The first contact pad electrically conductively connects to a further first contact of the substrate. The second contact of the semiconductor chip connects to a second contact pad, wherein the second contact pad is led to the end side, and wherein the second contact pad connects to the second electrical contact of the substrate at the end side. In this example, the electrically conductive connection between the contact pads and the further electrical contacts of the substrate may be effected in a simple manner with the aid of a solder material in the form of solder mounting.

The semiconductor chip may mechanically connect to a surface of the substrate via a connection material. The connection material constitutes a mechanical connection and mechanical securing of the semiconductor chip, e.g., to the surface of the substrate. As a result, a mechanical connection between the semiconductor chip and the substrate may be configured independently of the electrical connection. The connection material may consist of an electrically insulating or electrically conductive material. By way of example, the connection material may be realized in the form of an adhesive, for example, on the basis of silicone.

Depending on the example chosen, the conductor tracks may be arranged on the connection material. The connection material may be arranged, for example, in a manner adjoining the end side of the semiconductor chip and the surface of the substrate and thus at least partly fill the corner region between the semiconductor chip and the substrate.

The substrate may be configured as a carrier comprising two leadframe sections, wherein the leadframe sections are embedded into a carrier material. The leadframe sections may simultaneously be used as plated-through holes of the substrate. The contacts of the semiconductor chip and the further contacts of the substrate may connect to one another via an electrically conductive adhesive.

The electrically conductive adhesive may be configured as an anisotropically conductive adhesive. In this, the adhesive may connect both to all contacts of the semiconductor chip and to all further contacts of the substrate. A short circuit between the contacts of the semiconductor chip is avoided on account of the anisotropically conductive property.

The semiconductor chip may comprise a carrier substrate on which a layer arrangement is arranged. A top side of the layer arrangement forms a first side of the semiconductor chip. An underside of the carrier substrate forms a second side of the semiconductor chip. The contacts of the semiconductor chip are thus arranged on the top side of the layer arrangement and on the underside of the carrier substrate.

Our method comprises the advantage that the semiconductor chip may be secured on the substrate securely and stably in a simple manner. The semiconductor chips may be provided on a film, wherein a semiconductor chip is taken from the film, the semiconductor chip is rotated, and the semiconductor chip is placed by the end side on a top side of the substrate or on to an intermediate carrier. If the semiconductor chip is placed on to an intermediate carrier, then the semiconductor chip is subsequently placed on to the substrate and secured by the end side at the substrate. Electrically conductive lines between the electrical contacts of the semiconductor chip and the further contacts of the substrate are additionally configured.

The semiconductor chips may be detached from a film by a shearing element and subsequently secured on the substrate. In this case, an intermediate step may be provided in which the semiconductor chips are placed on to an intermediate carrier and only afterward connected to the substrate.

We also provide an apparatus for producing a component, wherein a film is provided to receive the semiconductor chips by an underside on a top side of a film, a track is provided for the film to move the film on the track, the track transitions from a planar section into a curved section in the direction of movement of the film, a shearing element is provided in the curved section, the curved section of the track is configured such that the film is released from the underside of the semiconductor chip at a side of the semiconductor chip that is on the end side in the direction of movement of the track, and a release region arises, wherein the shearing element comprises a shearing edge, the shearing edge engages into the release region between the semiconductor chip and the film, the shearing element is configured such that upon a further movement of the film the semiconductor chip slides by the underside along a top side of the shearing element and is moved with the end side on to a top side of a further carrier, and the end side is secured at the top side of the further carrier.

The advantageous configurations explained above may be applied individually or else in any desired combination with one another.

The above-described properties, features and advantages and the way in which they are achieved will become clearer and more clearly understood in association with the following description of examples explained in greater detail in association with the schematic drawings.

FIG. 1 shows, in a schematic illustration, a component 1 comprising a substrate 2 and a semiconductor chip 3. The semiconductor chip 3 is secured by an end side 4 on a top side of the substrate 2. Moreover, further electrical contacts 6, 7 are configured at the top side 5 of the substrate 2.

The semiconductor chip 3 comprises a layer arrangement comprising a plurality of layers comprising at least one p-conducting layer 8 and one n-conducting layer 9, wherein the p-conducting layer 8 and the n-conducting layer 9 adjoin one another in an active zone 10. In this example, the active zone 10 is arranged parallel to a top side 13 and to an underside 14. Likewise, the p-conducting layer 8 and the n-conducting layer 9 are arranged parallel to the active zone 10. The layer arrangement 11 is configured, for example, as an epitaxial layer arrangement constructed, e.g., from a III-V semiconductor material system. Furthermore, in the example illustrated, the semiconductor chip 3 comprises a carrier substrate 12, on which the layer arrangement 11 is arranged with the n-conducting layer 9. The carrier substrate 12 comprises approximately the same area as the n-conducting layer 9.

The semiconductor chip 3 is configured in a planar fashion and comprises a top side 13 and an underside 14. The top side 13 is formed by the p-conducting layer 8. The underside 14 is formed by the carrier substrate 12. The top side 13 and the underside 14 are configured, e.g., in a square or rectangular fashion. The semiconductor chip 3 comprises side faces, one of which forms the end side 4. The side faces are configured such that they are smaller, in particular narrower, than the top side 13 and the underside 14. A first contact 15 is configured on the top side 13 and a second contact 16 is configured on the underside 14. The first and second contacts 15, 16 electrically conductively connect to the p- and n-conducting layers 8, 9, respectively, and supply the active zone 10 with power in the event of energization. To that end, the carrier substrate 12 either is formed from an electrically conductive material or comprises electrically conductive plated-through holes. The active zone 10 is configured to generate an electromagnetic radiation upon energization.

The first contact 15 connects to the first further contact 6 of the substrate 2 via a first electrical line 17. The second contact 16 electrically conductively connects to the second further contact 7 via a second electrical line 18. The electrical lines 17 are configured in the form of bond wires. It is also possible to use other forms of electrical lines to configure the electrical connection between the contacts 15, 16 of the semiconductor chip 3 and the further contacts 6, 7 of the substrate 2. In addition, the first and second further contacts 6, 7 of the substrate 2 may also be configured at a side face. The carrier substrate 12 may, for example, also be configured from an electrically conductive, transparent material such as, for example, silicon carbide, gallium nitride, sapphire comprising plated-through holes, in particular composed of nanowires, indium titanium oxide or the like.

Furthermore, the carrier substrate 12 may be dispensed with. In this example without the carrier substrate 12, the n-conducting layer 9 forms the underside 14.

The semiconductor chip 3 may be configured as a light emitting semiconductor chip, in particular as a volume emitting semiconductor chip. By way of example, the semiconductor chip 3 may be configured as a laser diode or a light emitting diode. The p-conducting layer 8 is assigned to the top side 13 and the n-conducting layer 9 is assigned to the underside 14. However, the n-conducting layer 9 may also be assigned to the top side 13, and the p-conducting layer 8 to the underside 14. The end side 4 constitutes a narrower and smaller area compared to the top side 13 of the semiconductor chip 3 and the underside 14 of the semiconductor chip 3. The top side 5 of the substrate 2 may be provided with a specularly reflective layer or with a specularly reflective surface in particular in the region of the end side 4 or else over the whole area. Moreover, at least the top side 5 of the substrate 2 may consist of a reflective or highly scattering material.

On account of the arrangement described, a large proportion of the electromagnetic radiation generated by the active zone 10 is emitted by the component 1 without the electromagnetic radiation impinging on the top side 5 of the substrate 2. Moreover, only a small area is required on the substrate 2 for the mounting of the semiconductor chip 3. Consequently, one semiconductor chip 3 or a plurality of semiconductor chips 3 may be mounted on a substrate with a small area requirement. The component 1 may be provided with an encapsulation 19. The encapsulation 19 is produced from a material transparent to the electromagnetic radiation of the semiconductor chip 3. By way of example, the encapsulation 19 may consist of silicone or comprise silicone. Moreover, a conversion material may be embedded into the encapsulation 19, which conversion material at least partly shifts the wavelength of the electromagnetic radiation of the semiconductor chip 3. The encapsulation 19 covers all sides of the semiconductor chip 3 apart from the end side 4 bearing on the substrate 2. The encapsulation 19 is illustrated as transparent in FIG. 1. The encapsulation 19 may cover the entire top side 5 of the substrate 2 or only a partial region of the top side 5 of the substrate 2, as illustrated in FIG. 1.

Figure 2:
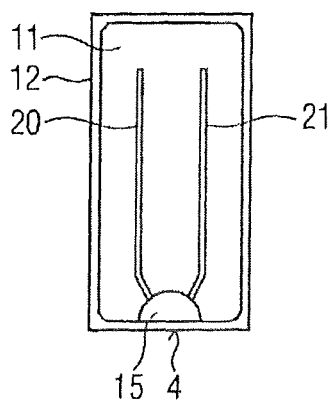
FIG. 2 shows a schematic view of the top side of the semiconductor chip.

FIG. 2 shows the top side 13 of the semiconductor chip 3 in a further view. In this case, the layer arrangement 11 in this example is configured in a manner set back circumferentially relative to an outer edge region of the carrier substrate 12. The first contact 15 is configured in a lower end region of the top side 13 of the layer arrangement 11 near the end side 4. Moreover, the first contact 15 comprises two contact tracks 20, 21 spaced apart from one another and, proceeding from the first contact 15, extend upward in the direction of a side face situated opposite the end side 4. The two contact tracks extend over 80% of the length of the layer arrangement 11.

Figure 3:
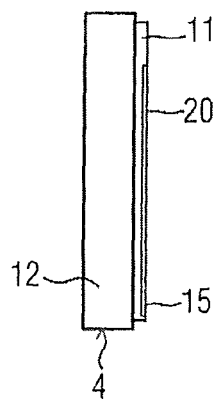
FIG. 3 shows a schematic side view of the semiconductor chip.

FIG. 3 shows a schematic side view of the semiconductor chip 3. In this case, the end side 4 is the lower narrow side face arranged adjacent to the first contact 15. The semiconductor chip 3 illustrated may comprise a width in the region of 500 μm, a length in the region of 1000 μm and a thickness in the region of 110 μm.

Figure 4:
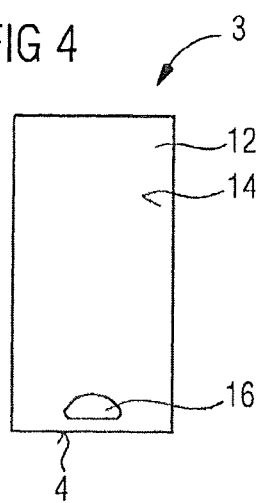
FIG. 4 shows a schematic view of the underside of the semiconductor chip.

FIG. 4 shows the underside 14 of the semiconductor chip 3, the underside being formed by the electrically conductive carrier substrate 12. The second contact 16 is configured on the underside 14 likewise in the lower region near the end side 4. The first and second contacts 15, 16 are arranged in a mirror-inverted fashion on the top side and respectively the opposite underside 13, 14. Both the planar configuration and the position of the first and second contracts 15, 16 may be chosen differently. The second contact 16 can also be configured on a side face of the carrier substrate 12.

Figure 5:
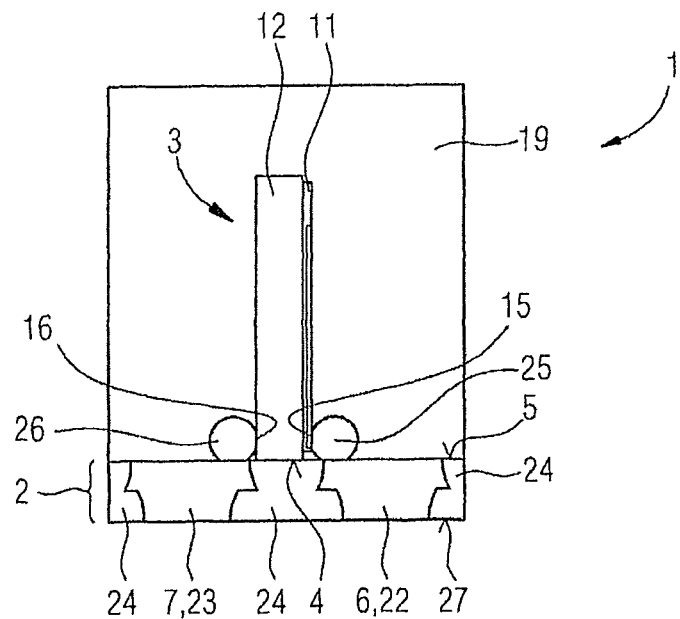
FIG. 5 shows a schematic cross-sectional illustration of a further example of a component.

FIG. 5 shows, in a schematic cross-sectional illustration, a further example of a component 1 comprising a semiconductor chip 3 configured in accordance with FIGS. 2 to 4. The semiconductor chip 3 is provided with an encapsulation 19, which may also comprise conversion material. The encapsulation 19 covers the entire top side 5 of the substrate 2. The substrate 2 comprises two leadframe sections 22, 23 embedded into a carrier material 24. The carrier material 24 may comprise or constitute, for example, a mold material such as, for example, epoxy or silicone. In particular, the carrier material 24 may comprise a white color and be configured in a highly reflective fashion. To that end, scattering particles composed, e.g., of titanium oxide may be embedded into the mold material. The semiconductor chip 3 is arranged with the end side 4 between the leadframe sections 22, 23 on the top side 5 of the substrate 2 in the region of the carrier material 24. A first contact element 25 is arranged between the first contact 15 of the semiconductor chip 3 and the further first contact 6 of the substrate 2. The first contact element 25 consists of an electrically conductive material such as, for example, a metal or a metal alloy. Moreover, the first contact element 25 comprises a spherical shape or a partly spherical shape. The first contact element 25 produces an electrically conductive connection between the first contact 15 and the further first contact 6, wherein the further first contact 6 is constituted by the first leadframe section 22.

Furthermore, the second contact 16 of the semiconductor chip 3 electrically and mechanically connects to the second leadframe section 23 via a second contact element 26. The second contact element 26 may likewise be formed from an electrically conductive material and comprise, for example, the shape of a sphere or partial sphere. The second contact element 26 produces an electrically conductive connection between the second contact 16 and the further second contact 7, wherein the further second contact 7 is constituted of the second leadframe section 23.

The first and second leadframe sections 22, 23 project from the top side 5 of the substrate 2 as far as an underside 27 of the substrate 2. Consequently, the first and second leadframe sections 22, 23 constitute an electrical plated-through hole through the substrate 2. The first and second leadframe sections 22, 23 are formed from an electrically conductive material such as copper, for example. However, the leadframe sections may also be produced from other, in particular electrically conductive, materials.

The substrate 2 in FIG. 5 constitutes, e.g., a QFN substrate comprising leadframe sections composed of copper electro-chemically coated with nickel and silver. Consequently, the surfaces of the leadframe sections 22, 23 are specularly reflective. Furthermore, a white, highly reflective molding compound is injection-molded around the leadframes. Furthermore, the substrate with carrier arms of the leadframe sections may be laterally connected to further components.

The contact elements 25, 26 may, for example, consist of a tin-silver-copper alloy and be applied with the aid of an SB$^2$ laser jet method. To electrically connect the contact elements, it is necessary for the material of the contact element to be melted. Consequently, it is also possible to use metals having a high melting point such as gold, tin or silver for the configuration of the contact elements.

Figure 6:
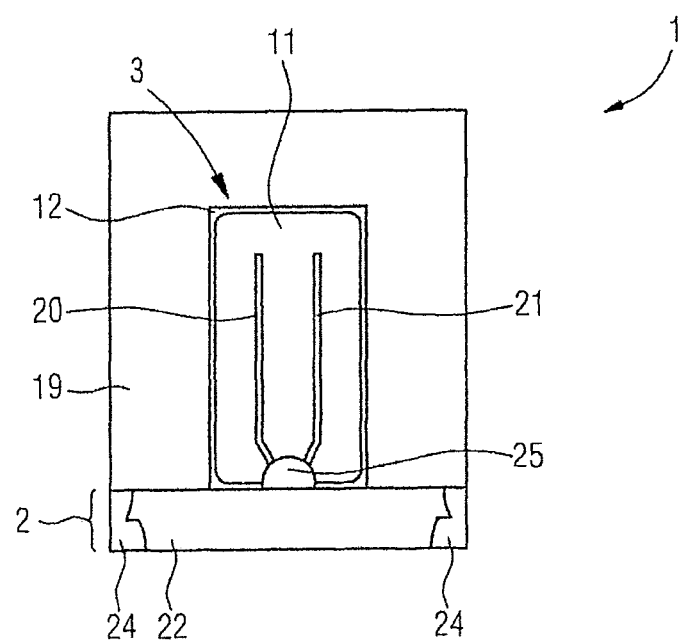
FIG. 6 shows a schematic side view of the component from FIG. 5 with a view of the top side of the semiconductor chip.

FIG. 6 shows a schematic cross section through the component 1 from FIG. 5 with a view of the top side 13 of the semiconductor chip 3. In this case, the section is taken through the first leadframe section 22.

Figure 7:
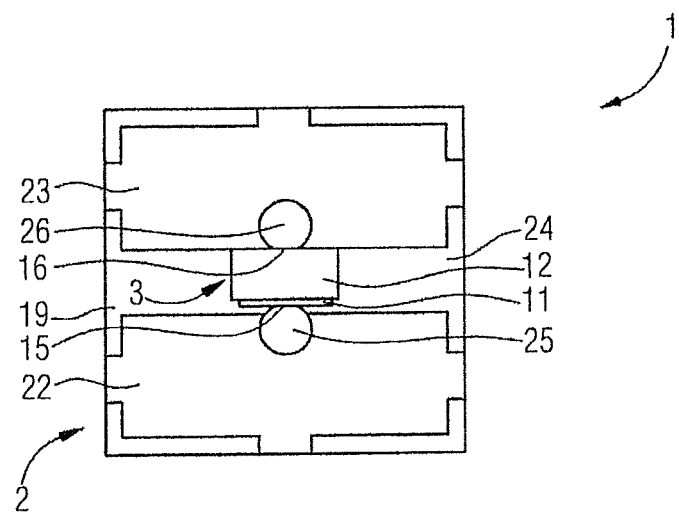
FIG. 7 shows a schematic view from above of the component from FIG. 5.

FIG. 7 shows a schematic cross section through the component 1 from FIG. 5 at the level of the contact elements 25, 26 and parallel to the top side 5 of the substrate 2.

Figure 8:
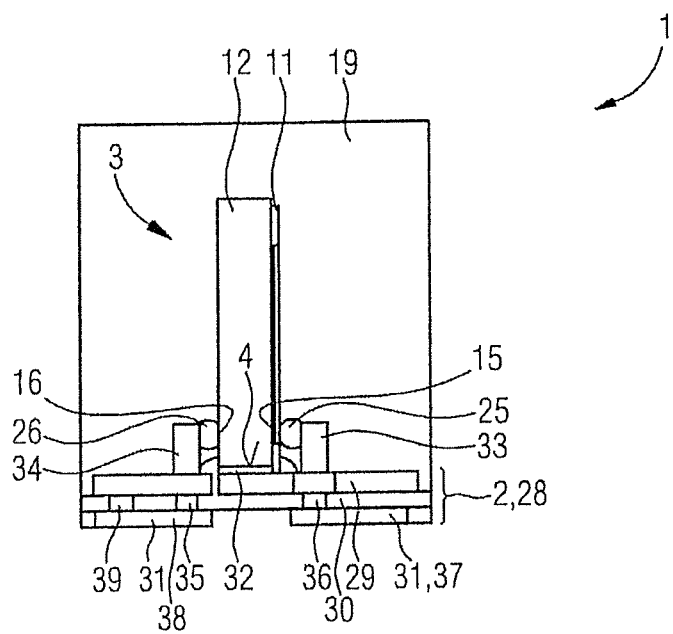
FIG. 8 shows a schematic cross section through a further example of a component.

FIG. 8 shows, in a schematic cross section, a further example of a component 1 comprising a semiconductor chip 3 and an encapsulation 19 in accordance with the example in FIGS. 2 to 4. The semiconductor chip 3 is secured by the end side 4 on a substrate 2. The substrate 2 is configured as a multilayered carrier 28. The multilayered carrier 28 comprises an upper layer 29, a middle layer 30 and a lower contact layer 31. The upper layer 29 may be configured in the form of a front-side metallization. The lower contact layer 31 is configured as a rear-side metallization. The middle layer 30 of the multilayer carrier 28 is configured in an electrically insulating fashion. The end side 4 of the semiconductor chip 3 is secured on the upper layer 29 with the aid of an electrically insulating connection material 32. Consequently, the end side 4 of the semiconductor chip 3 is electrically insulated from the electrically conductive upper layer 29. The end side may also comprise an insulation layer.

In addition, a first and a second electrically conductive pin 33, 34 are configured on the upper layer 29. The first pin 33 is arranged laterally at a distance in front of the first contact 15 of the semiconductor chip 3. In addition, a first contact element 25 is provided between the first contact 15 and the first pin 33. Consequently, the first contact 15 electrically conductively connects to the first pin 33. The second pin 34 is arranged laterally at a distance in front of the second contact 16 of the semiconductor chip 3. A second contact element 26 is provided between the second pin 34 and the second contact 16. The second contact element 26 produces an electrically conductive connection between the second contact 16 and the second pin 34. The first and second contact elements 25, 26 may be configured from an electrically conductive material, in particular in a spherical shape. In a further example, the first and second contact elements 25, 26 may also be formed from a solder material.

The second pin 34 is configured in a manner electrically insulated from the upper layer 29 and is connected to a second section 38 of the contact layer 31 via a second electrical plated-through hole 35. The first pin 33 directly connects to the upper layer 29 and additionally connects to a first section 37 of the contact layer 31 via a first plated-through hole 36. Furthermore, thermal plated-through holes 39 may be provided, which electrically conductively connect the upper layer 29 to the lower contact layer 31.

The pins 33, 34 may be applied on the upper layer 29, for example, with the aid of an electrodeposition method. The electrically conductive pin elements 33, 34 may also be produced with the aid of an embossing method. With the aid of the plated-through holes 35, 36, the electrical contacts 15, 16 of the semiconductor chip 3 electrically conductively connect to the first and second sections 37, 38, respectively, of the contact layer 31, which are configured on the underside of the multilayered carrier 28. The lower layer 30 may consist, for example, of PI or FR4 circuit board material. Moreover, the multilayered carrier 28 may be configured as a flexible circuit board.

Figure 9:
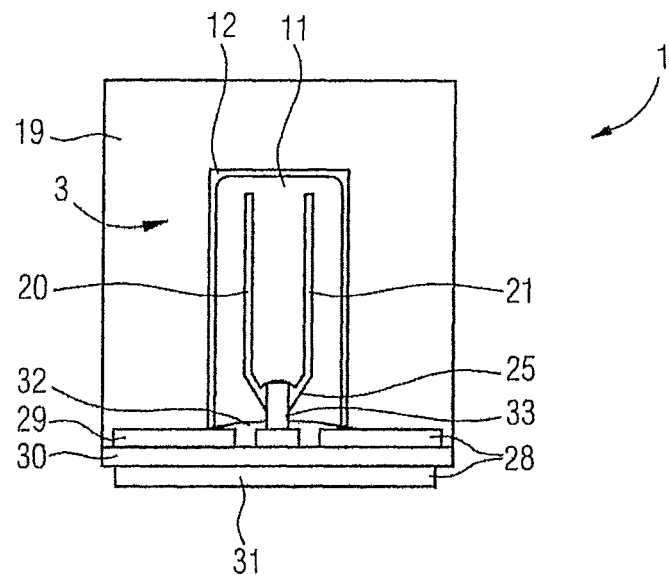
FIG. 9 shows a schematic view of the top side of the semiconductor chip of the component from FIG. 8.

FIG. 9 shows a schematic cross section through the component from FIG. 8 with a view of the top side 13 of the semiconductor chip 3.

Figure 10:
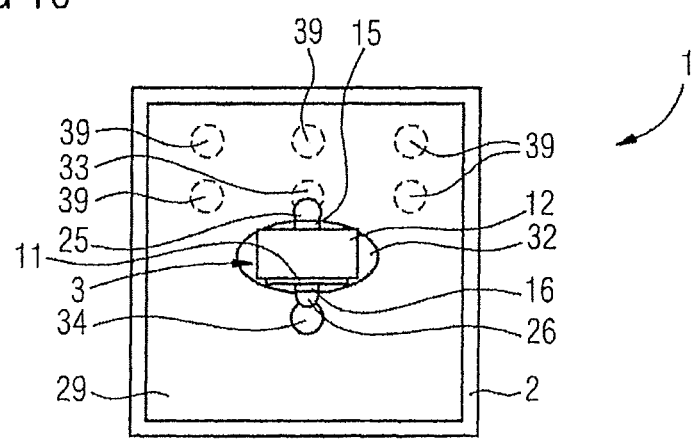
FIG. 10 shows a schematic plan view from above of the component from FIG. 8.

FIG. 10 shows a view from above of the component 1 from FIG. 8, wherein the upper layer 29 may comprise a mirror layer. By way of example, the upper layer 29 is formed from metal and polished. In particular, the upper layer 29 as mirror layer may comprise a layer composed of polished silver. Moreover, a plurality of thermal plated-through holes 39 are illustrated by dashed lines in FIG. 10. The thermal plated-through holes 39 serve for improved dissipation of heat from the upper layer 29 of the multilayered carrier 28 to the lower contact layer 31.

Figure 11:
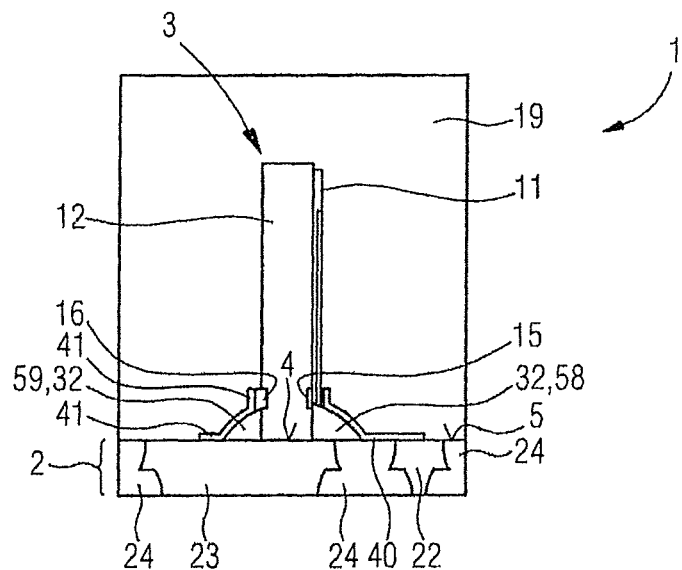
FIG. 11 shows a schematic cross section through a further example of a component.

FIG. 11 shows a schematic cross section through a further example of a component 1 comprising a semiconductor chip 3 and an encapsulation 19 in accordance with FIGS. 1 to 4, wherein, in this example, the substrate 2 comprises leadframe sections 22, 23 and a carrier material 24 in accordance with FIG. 5. The semiconductor chip 3 is arranged by the end side 4 on the second leadframe section 23. Furthermore, a connection material 32 is arranged in a manner adjoining the end side 4 between the substrate 2 and the semiconductor chip 3. The connection material 32 is formed, for example, from an electrically insulating adhesive material. The connection material 32 surrounds the end side 4 of the semiconductor chip 3 and adjoins the side faces and the top side 13 and the underside 14. The connection material 32 secures the semiconductor chip 3 at the top side 5 of the substrate 2. Material bumps 58, 59 composed of the connection material 32 are arranged in a manner adjoining the top side 13 and adjoining the underside 14. The first and second contacts 15, 16 of the semiconductor chip 3 are arranged above the connection material 32. In addition, provision is made of a first conductor track 40 composed of an electrically conductive material led from the first contact 15 to the first leadframe section 22. In this case, the first conductor track 40 is arranged on the first material bump 58 composed of connection material 32. The first conductor track 40 is configured as an elongate strip. In addition, a second conductor track 41 is provided, which is led from the second contact 16 to the second leadframe section 23. The second conductor track 41 is arranged on the second material bump 59 composed of the connection material 32. The material bumps 58, 59 of the connection material 32 in the region between the top side 13 of the semiconductor chip 3 and the top side 5 of the substrate 2 and between the underside 14 of the semiconductor chip 3 and the top side 5 of the substrate 2 fill corner regions between the semiconductor chip 3 and the substrate 2. Consequently, application of the conductor tracks 40, 41 on the material bumps 58, 59 of the connection material 32 is possible more simply and more reliably. Moreover, the long-term stability of the conductor tracks 40, 41 is improved.

Figure 12:
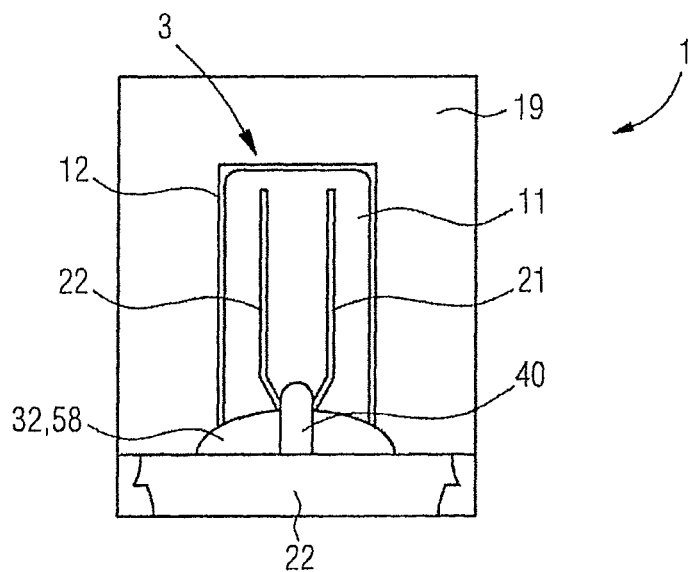
FIG. 12 shows a schematic plan view from above of the top side of the semiconductor chip of the component from FIG. 11.

FIG. 12 shows a cross section through the arrangement from FIG. 11 with a view of the top side 13 of the semiconductor chip 3 and with a view of the first conductor track 40. The cross section passes through the first leadframe section 22.

Figure 13:
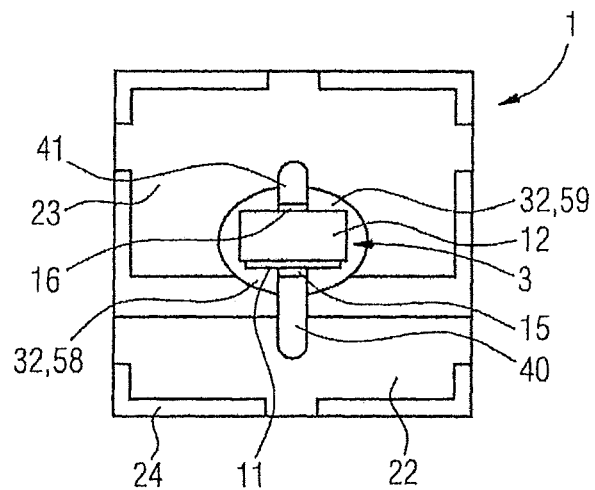
FIG. 13 shows a schematic plan view from above of the component from FIG. 11.

FIG. 13 shows a plan view of the arrangement from FIG. 11. The connection material 32 surrounds the end side 4 on all four side faces of the semiconductor chip 3 in the form of a continuous material bump. The conductor tracks 40, 41 may be deposited, for example, with the aid of a 3D aerosol jet method. With the aid of this printing method, it is possible to achieve a secure and reliable application of the conductor tracks 40, 41 on the contacts 15, 16, the connection material 32 and the leadframe sections 22, 23 and/or the carrier material 24. By way of example, the conductor tracks 40, 41 are formed from electrical material, in particular from silver.

Figure 14:
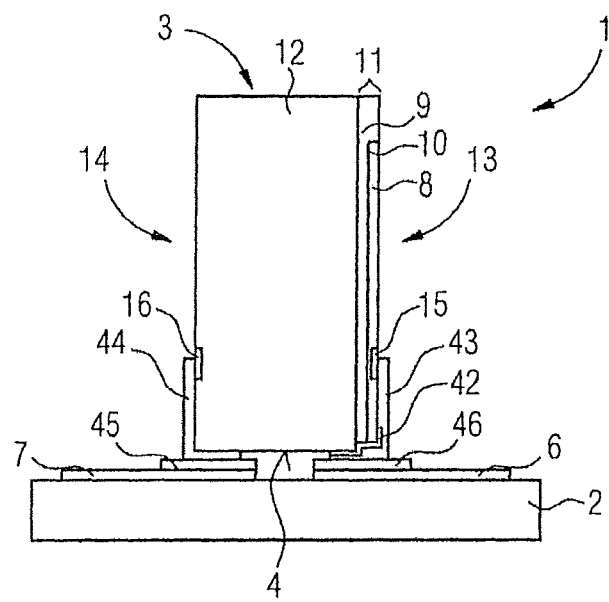
FIG. 14 shows a schematic cross section through a further component comprising a further semiconductor chip comprising an edge metallization.

FIG. 14 shows, in a schematic partial cross section, a component 1 comprising a semiconductor chip 3, which, adjoining the end side 4 and adjoining the layer arrangement 11, comprises an insulation layer 42, which covers the layer arrangement 11 on the end side 4 and in a lower region of the top side 13. In addition, a first contact pad 43 is provided, which, proceeding from the top side 13, extends from the first contact 15 laterally via the corner region right on to the end side 4 of the insulation layer 42. In addition, a second contact pad 44 is provided, which, proceeding from the second contact 16 on the underside 14 of the carrier substrate 12, extends via the corner region right on to the end side 4. In the region of the end side 4, the first and the second contact pads 43, 44 are arranged and connected on further first and second contacts 6, 7 of the substrate 2. For this purpose, an electrically conductive connection material such as solder 45, 46, for example, may be provided. Consequently, a fast and secure mounting of the semiconductor chip 3 on the substrate 2 may be achieved with solder mounting and with a chip edge metallization.

Figure 15:
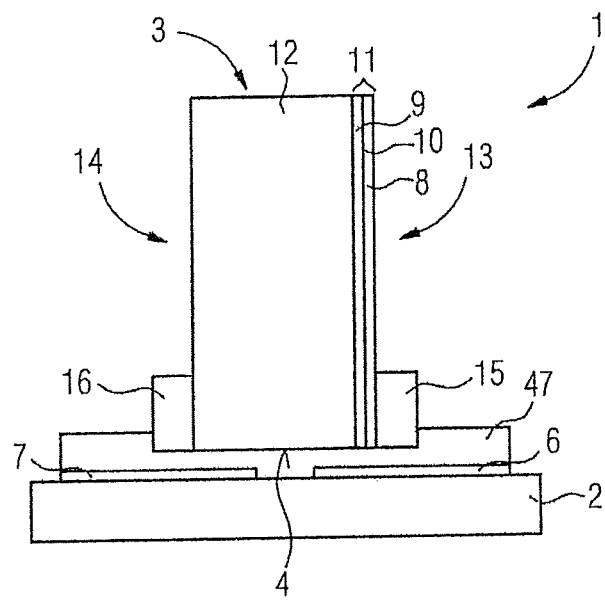
FIG. 15 shows a further example of a component in which the semiconductor chip connects to the substrate via an electrically conductive adhesive.

FIG. 15 shows a further example of a component 1 in which the semiconductor chip 3 is configured in accordance with FIGS. 2 to 4. The substrate 2 comprises a first and second further contact 6, 7 on the top side 5. Furthermore, the semiconductor chip 3 comprises the first contact 15 on the top side 13 and the second contact 16 on the underside 14. The semiconductor chip 3 is secured by the end side 4 on the substrate 2, wherein an electrically conductive adhesive layer 47 is provided for securing purposes. The electrically conductive adhesive layer 47 is produced from an anisotropically conductive adhesive. Consequently, an integral adhesive layer 47 may be provided for electrically conductive connection between the first contact 15 and the first further contact 6 and additionally between the second contact 16 and the second further contact 7. With the use of an isotropically conductive adhesive, two separate adhesive layers to secure and electrically conductively connect the contacts 15, 16 to the respective further contacts 6, 7 are required to avoid an electrically conductive short circuit between the first and second contacts 15, 16.

Figure 16:
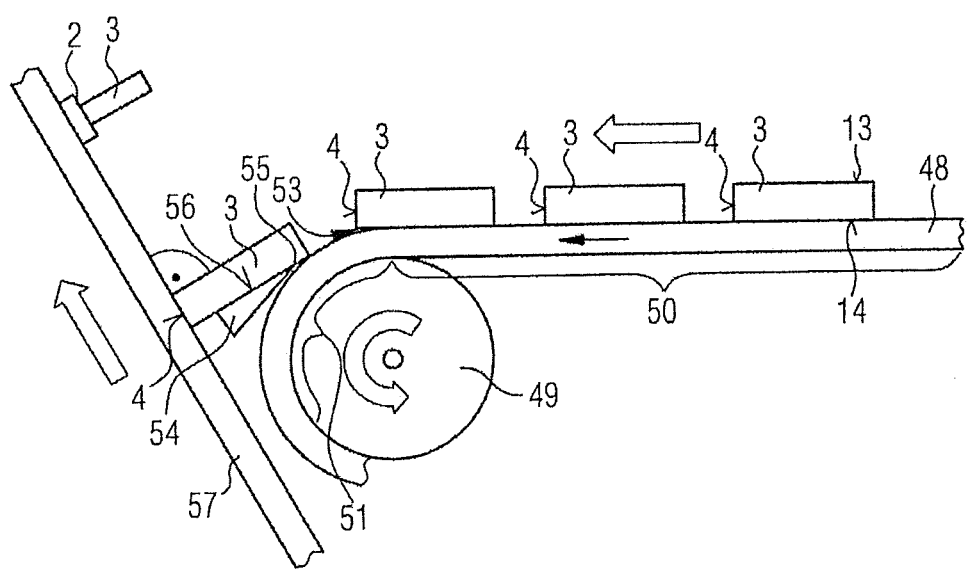
FIG. 16 shows an apparatus for shearing semiconductor chip from a carrier film.

FIG. 16 shows a schematic illustration of an apparatus for peeling semiconductor chips 3 from a film 48. The semiconductor chip 3 is configured, for example, in accordance with FIGS. 2 to 4 and is arranged by the underside 14 on a top side of the film 48. The film 48 is moved by a roller 49 on a track in the direction of the roller. The track transitions from a planar section 50 into a curved section 51 in a contact region with the roller 49. In the curved section 51 of the track, at an end side 4 of the semiconductor chip the underside 14 of the semiconductor chip 3 is released from the film 48. As a result, a release region 53 is configured between the underside 14 of the semiconductor chip 3 and the top side of the film 48.

In the region of the roller 49, a shearing element 54 is provided in a manner adjoining the curved section 51. The shearing element 54 comprises a shearing edge 55, wherein the shearing edge 55 is aligned such that the shearing edge 55 engages into the release region 53 between the semiconductor chip 3 and the film 48. The shearing element 54 comprises a top side 56, along which the sheared-away semiconductor chip 3 slides and bears on a top side of a further carrier 57 by the end side 4. The further carrier 57 comprises, for example, an adhesive top side or a connection material is additionally applied to secure the end side 4 of the semiconductor chip 3 on the further carrier 57. The further carrier 57 may likewise be configured in the form of a film that is moved further upward away from the roller 49. In this way, the semiconductor chips 3 from the film 48 may be secured by their end side on the further carrier 57 using simple means.

The further carrier 57 may be configured as a substrate or substrates may be arranged on the further carrier 57. The semiconductor chips 3 may then be directly applied by the end side 4 on the carrier 2.

In addition, the further carrier 57 may constitute an intermediate carrier, proceeding from which the semiconductor chip 3 is secured by the end side on the substrate 2.

The vertical chip mounting proposed comprises the advantage that a higher efficiency for the light emission is achieved since fewer loss areas are arranged in the vicinity of the emission face of the semiconductor chip. Even the substrate 2, in a reflectively coated surface, comprises a finite reflectivity and thus a loss area.

The vertical chip mounting reduces the risk of a short circuit since the contacts 15, 16 of the semiconductor chip 3 are arranged on two different sides of the chip. Moreover, stabler mounting is achieved as a result of the symmetrical securing on two opposite sides of the chip. Furthermore, complex chip edge metallizations are not required. The layer arrangement 11, for example, configured as an epitaxial layer and structured with a circumferential chamfer, i.e., by a mesa. In addition, both the first and the second electrical contacts 15, 16 are configured to be as small as possible to keep absorption losses as low as possible.

In general, the semiconductor chips are typically processed as a slice on a wafer and, before singulation, are laminated on to the film and separated. To be able to use standard die bonding installations, it is advantageous to erect the chips by 90°. In the apparatus, the semiconductor chips are peeled from the film by a wedge and laminated on to the further film at 90°.

A mounting sequence may be manifested as follows: the semiconductor chip 3 is gouged from a film. The semiconductor chip 3 is then rotated by 90° and transferred to a bonding head of a bonding apparatus. The semiconductor chip 3 is subsequently positioned and held on the substrate. The contact elements 25, 26 are simultaneously connected on both sides.

The substrate may be formed from a circuit board. The circuit board may comprise thermal and electrical through contacts. The circuit board may, for example, be configured such that it is very thin and may have a diameter of only 20 μm. In addition, the circuit board may also be configured in a thicker fashion and have a diameter of 200 μm. In this case, the thermal plated-through holes are situated on only half of the substrate of the component because short circuits would arise otherwise. A front-side metallization is embodied over a large area to form the best possible mirror. This is an advantage over the QFN substrate, in which the semiconductor chip is seated above the molding compound, which generally comprises poorer reflection properties than silver surfaces. As a further example, the circuit board may comprise pins, which make it possible to use an electrically insulating connection material. As a result, the mounting process can be better organized and it is possible to use standard machines for the chip mounting and the electrical connection.

The mounting process may also be manifested as follows: providing the semiconductor chips, chip mounting by pick-and-place on the substrate with insulating adhesive. Applying the contact elements by jetting in a different installation. The use of the electrically insulating connection material makes it possible to mount the end side of the semiconductor chip on a highly reflective metal layer composed, for example, of silver.

With the use of solder as connection material, the solder may already be situated on the substrate. The semiconductor chip is, for example, secured with a flux and mounted in a reflow process. Moreover, the semiconductor chip may itself entrain the solder material and be mounted, for example, by a heated bond head process. To avoid short circuits, an electrical passivation of the semiconductor edge is necessary. The requirement made of the solder and the installations is relatively stringent to avoid short circuits. If the solder is applied on the chip edge, the latter has to be structured such that no short circuits occur. The semiconductor chip may be fixed on the substrate beforehand by a UV-curing adhesive drop. Grooving may be carried out by sandblasting, plasma etching or RIE etching. The grooving may possibly also be dispensed with if the epitaxial layer is gone back a little and expanded somewhat after singulation.

This application claims priority of DE 10 2016 122 810.9, the subject matter of which is incorporated herein by reference.

The invention claimed is:

1. A component comprising a light emitting semiconductor chip, wherein the semiconductor chip comprises a layer arrangement comprising a plurality of layers comprising at least one p-conducting layer and one n-conducting layer, the p-conducting layer and the n-conducting layer adjoin one another in an active zone, the active zone is arranged in a first plane, the p-conducting layer and the n-conducting layer are arranged parallel to the first plane, the p-conducting layer and the n-conducting layer are arranged at opposite sides with respect to the first plane, a first electrical contact is configured on the p-conducting side of the layer arrangement at a first side of the layer arrangement of the semiconductor chip, a second electrical contact is configured on the n-conducting side of the layer arrangement at a second side of the semiconductor chip, said second side being situated opposite the first side of the semiconductor chip with respect to the active zone, the first side and the second side are arranged at opposite sides with respect to the first plane of the active zone, wherein the first plane is between the first and the second side, the semiconductor chip comprises side faces arranged between the first side and the second side, wherein the side faces are arranged transversely to the first plane of the active zone, one of the side faces is an end side of the semiconductor chip, a substrate with a top side arranged transversely to the first plane of the active zone, the first side of the semiconductor chip transitions into the second side via the end side, the semiconductor chip is secured by the end side on the top side of the substrate, the substrate comprises a first and second further electrical contact, and the further electrical contacts electrically conductively connect to the electrical contacts of the semiconductor chip.

2. The component according to claim 1, wherein the further contacts of the substrate comprise a first and second pin, the first and second pins are arranged at a predefined distance only on the top side of the substrate, and the semiconductor chip is arranged with the entire end side between the first and second pins, the entire first pin is arranged laterally at a distance in front of the first side of the semiconductor chip on the top side of the substrate, the entire second pin is arranged laterally at a distance in front of the second side of the semiconductor chip on the top side of the substrate, the first pin projects only from the top side of the substrate a predetermined distance along the first side of the semiconductor chip in a direction of a second end side of the semiconductor chip arranged opposite the end side of the semiconductor chip, and the second pin projects only from the top side of the substrate a predetermined distance along and in front of the second side of the semiconductor chip in the direction of the second end side of the semiconductor chip arranged opposite the end side of the semiconductor chip, wherein the first pin and the second pin are arranged at opposite sides with respect to the first plane of the active zone.

3. The component according to claim 1, wherein the electrical contacts of the semiconductor chip electrically conductively connect to the further electrical contacts of the substrate via electrically conductive contact elements, the contact elements are a first and second contact ball, the further contacts of the substrate comprise a first and a second pin, the first and second pins are arranged at a predefined distance only on the top side of the substrate, and the semiconductor chip is arranged with the entire end side between the first and second pins, the entire first pin is arranged laterally at a distance in front of the first contact of the semiconductor chip, the entire second pin is arranged laterally at a distance in front of the second contact of the semiconductor chip, the first pin projects only from the top side of the substrate a predetermined distance along and in front of the first side of the semiconductor chip, and the second pin projects only from the top side of the substrate a predetermined distance along and in front of the second side of the semiconductor chip, wherein the first pin and the second pin are arranged at opposite sides with respect to the first plane of the active zone, wherein the first contact ball directly contacts the first contact and the first pin, and the second contact ball directly contacts the second pin and the second contact.

4. The component according to claim 1, wherein the semiconductor chip connects to a surface of the substrate via a connection material, the connection material directly contacts the first side face and the second side face of the semiconductor chip and the top side of the substrate, the first and the second contact of the semiconductor chip are arranged above the connection material, the first contact of the semiconductor chip is connected via a first conductor track to the first further contact of the substrate, the first conductor track is arranged on the first contact of the semiconductor chip, on the surface of the connection material and on the first further electrical contact of the substrate, the second contact of the semiconductor chip is connected via the second conductor track to the second further contact of the substrate, and the second conductor track is arranged on the second contact of the semiconductor chip, on the surface of the connection material and on the second further electrical contact of the substrate.

5. The component according to claim 1, wherein the semiconductor chip comprises on the end side an insulation layer, the insulation layer is arranged with a lower side on the top side of the substrate, the insulation layer covers the layer arrangement in a lower region of the first side and extends via a corner region of the layer arrangement on the end side of the semiconductor chip, a first contact pad is provided on an upper side of the insulation layer opposite the lower side of the insulation layer, the first contact pad proceeds from the first contact laterally via the upper side of the corner region of the insulation layer to the end side of the insulation layer and connects to the first further electrical contact of the substrate, a second contact pad is provided on the second side of the semiconductor chip, and the second contact pad proceeds from the second contact of the semiconductor chip along the second side of the semiconductor chip to the second further electrical contact of the substrate.

6. The component according to claim 1, wherein the semiconductor chip comprises on the end side an insulation layer, the insulation layer covers the layer arrangement in a lower region of the first side of the semiconductor chip and extends via a corner region on the end side of the semiconductor chip, the corner region of the insulation layer is arranged with a lower side on the substrate, the corner region of the insulation layer comprises an upper side arranged opposite the lower side, a first contact pad proceeds from the first contact laterally along an outer side of the corner region of the insulation layer parallel to the first side to the end side of the insulation layer and is connected to the first further contact, a second contact pad proceeds from the second contact of the semiconductor chip along the second side of the semiconductor chip to the end side of the semiconductor chip, wherein an edge section of the second contact pad is arranged on the end side of the semiconductor chip, wherein the edge section of the second contact pad is connected with the second further contact of the substrate, solder material is arranged between the contact pads of the semiconductor chip and the further contacts of the substrate, the solder material produces the electrical connection between the contact pads and the further contacts, and the solder material secures the semiconductor chip at the substrate.

7. The component according to claim 1, wherein the further electrical contacts of the substrate comprise electrically conductive through holes, the through holes extend from the top side of the substrate to an underside of the substrate, and the through holes are arranged within the substrate.

8. The component according to claim 1, wherein the further electrical contacts of the substrate comprise electrically conductive through holes, the through holes extend from the top side of the substrate to an underside of the substrate, the through holes are arranged within the substrate, the substrate is configured as a carrier comprising two leadframe sections, the leadframe sections are embedded into a carrier material, and the leadframe sections constitute electrically conductive through holes.

9. The component according to claim 1, wherein the contacts of the semiconductor chip and the further contacts of the substrate connect to one another via an electrically conductive adhesive.

10. The component according to claim 1, wherein the contacts of the semiconductor chip and the further contacts of the substrate connect to one another via a single layer of an electrically conductive adhesive, the electrically conductive adhesive is configured as an anisotropically conductive adhesive, and the adhesive connects to the contacts of the semiconductor chip and the further contacts of the substrate.

11. The component according to claim 1, wherein the semiconductor chip comprises a carrier substrate, the carrier substrate comprises a top side and an opposite arranged underside, the layer arrangement is arranged on the top side of the carrier substrate, a top side of the layer arrangement forms the first side of the semiconductor chip, the underside of the carrier substrate forms the second side of the semiconductor chip, and the first and respectively the second electrical contact of the semiconductor chip are configured on the top side of the layer arrangement and on the underside of the carrier substrate.

12. The component according to claim 1, wherein a first and a second material bump of connection material are arranged on the substrate, the first bump adjoins the first side of the semiconductor chip, the second bump adjoins the second side of the semiconductor chip, the first contact of the semiconductor chip is arranged above the first bump, the second contact of the semiconductor chip is arranged above the second bump, a first conductor track composed of an electrically conductive material and embodied as an elongated strip is led from the first contact via a top surface of the first bump to an area of the further first contact of the substrate that is arranged beside the first bump, and a second conductor track composed of an electrically conductive material and embodied as an elongated strip is led from the second contact via a top surface of the second bump to an area of the further second contact of the substrate that is arranged beside the second bump.

13. The component according to claim 3, wherein the first contact ball directly contacts the first contact and the first pin at a given distance from the top surface of the substrate, and the second contact ball directly contacts the second pin and the second contact at a given distance from the top surface of the substrate.

14. The component according to claim 2, wherein the substrate is configured as a multilayered carrier, the multilayered carrier comprises an upper layer, a middle layer and a lower contact layer, the upper layer is configured in the form of a front-side metallization, the lower contact layer is configured as a rear-side metallization, the middle layer of the multilayer carrier is configured in an electrically insulating fashion, the end side of the semiconductor chip is secured on the upper layer with the aid of the electrically insulating connection material, the end side of the semiconductor chip is electrically insulated from the electrically conductive upper layer, the first and second electrically conductive pin are configured only on the upper layer, and the second pin is configured in a manner electrically insulated from the upper layer and is connected to a second section of the lower contact layer via a second electrical plated-through hole.

15. The component according to claim 1, wherein all sides of the semiconductor chip beside the end side that bears on the substrate are covered by an encapsulation, and the encapsulation is produced from a material that is transparent to the electromagnetic radiation of the semiconductor chip.

16. The component of claim 15, wherein conversion material is embedded into the encapsulation, which conversion material at least partly shifts the wavelength of the electromagnetic radiation of the semiconductor chip.

17. The component of claim 1, wherein the substrate comprises two leadframe sections, which are embedded into a carrier material, the carrier material constitutes mold material, the semiconductor chip is arranged with the end side between the leadframe sections on a top side of the carrier material, a first contact element is arranged between the first contact of the semiconductor chip and the further first contact, the first contact element consists of an electrically conductive material, the first contact element produces an electrically conductive connection between the first contact and the further first contact, and the further first contact is constituted by the first leadframe section, the second contact of the semiconductor chip is electrically and mechanically connected to the second leadframe section via a second contact element, the second contact element is formed from an electrically conductive material, the second contact element produces an electrically conductive connection between the second contact and the further second contact, and the further second contact is constituted by the second leadframe section.

18. The component of claim 17, wherein the carrier material comprises a white color and is configured in a highly reflective fashion comprising scattering particles.

19. The component of claim 2, wherein the substrate is configured as a multilayered carrier, the multilayered carrier comprises an upper layer, a middle layer and a lower contact layer, the upper layer is configured in the form of a front-side metallization, the lower contact layer is configured as a rear-side metallization, the middle layer of the multilayer carrier is configured in an electrically insulating fashion, the end side of the semiconductor chip is secured on the upper layer with the aid of the electrically insulating connection material, the end side of the semiconductor chip is electrically insulated from the electrically conductive upper layer, the first and second electrically conductive pin are configured only on the upper layer, the second pin is configured in a manner electrically insulated from the upper layer and is connected to a second section of the lower contact layer via a second electrical plated-through hole, and the upper layer comprises a mirror layer, wherein a plurality of thermal plated-through holes are arranged, the thermal plated-through holes serve for improved dissipation of heat from the upper layer of the multilayered carrier to the lower contact layer.

* * * * *